(12) United States Patent
Costello et al.

(10) Patent No.: US 8,957,380 B2
(45) Date of Patent: Feb. 17, 2015

(54) INFRARED ATTENUATING OR BLOCKING LAYER IN OPTICAL PROXIMITY SENSOR

(75) Inventors: James Costello, Singapore (SG); Rani Saravanan, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 487 days.

(21) Appl. No.: 13/098,436

(22) Filed: Apr. 30, 2011

(65) Prior Publication Data

US 2011/0204233 A1    Aug. 25, 2011

Related U.S. Application Data

(63) Continuation-in-part of application No. 12/495,739, filed on Jun. 30, 2009.

(51) Int. Cl.
| | | |
|---|---|---|
| G01S 7/481 | (2006.01) | |
| G01S 7/48 | (2006.01) | |
| G01S 17/02 | (2006.01) | |
| H03K 17/94 | (2006.01) | |
| H03K 17/945 | (2006.01) | |

(52) U.S. Cl.
CPC ............ G01S 7/4813 (2013.01); H03K 17/941 (2013.01); *H03K 2017/9455* (2013.01); G01S 17/026 (2013.01); *H03K 2217/94108* (2013.01)
USPC ................. 250/341.8; 250/338.1; 250/339.06

(58) Field of Classification Search
USPC .............. 250/551, 239, 338.1, 341.1, 339.06, 250/341.8; 257/81, 99, 80; 438/25
See application file for complete search history.

(56) References Cited

U.S. PATENT DOCUMENTS

| | | |
|---|---|---|
| 5,155,777 A | 10/1992 | Angelopoulos et al. |
| 5,367,393 A | 11/1994 | Ohara et al. |

(Continued)

FOREIGN PATENT DOCUMENTS

| | | |
|---|---|---|
| CN | 1743886 | 8/2006 |
| CN | 1832217 | 9/2006 |

(Continued)

OTHER PUBLICATIONS

Agilent HSDL-9100 Miniature Surface-Mount Proximity Sensor Data Sheet, Aug. 26, 2004.

(Continued)

*Primary Examiner* — David Porta
*Assistant Examiner* — Yara B Green

(57) ABSTRACT

An optical proximity sensor is provided that comprises an infrared light emitter an infrared light detector, a first molded optically transmissive infrared light pass component disposed over and covering the light emitter and a second molded optically transmissive infrared light pass component disposed over and covering the light detector. Located in-between the light emitter and the first molded optically transmissive infrared light pass component, and the light detector and the second molded optically transmissive infrared light pass component is a gap. Layers of infrared opaque, attenuating or blocking material are disposed on at least some of the external surfaces forming the gap to substantially attenuate or block the transmission of undesired direct, scattered or reflected light between the light emitter and the light detector, and thereby minimize optical crosstalk and interference between the light emitter and the light detector.

28 Claims, 8 Drawing Sheets

(56) References Cited

U.S. PATENT DOCUMENTS

| | | | |
|---|---|---|---|
| 5,567,953 A | 10/1996 | Horinouchi et al. | |
| 5,675,143 A | 10/1997 | Heimlicher | |
| 5,760,390 A | 6/1998 | Vezzalini et al. | |
| 5,811,797 A | 9/1998 | Kobachi et al. | |
| 6,064,062 A | 5/2000 | Bohn | |
| 6,135,816 A | 10/2000 | Mashiyama et al. | |
| 6,180,881 B1 | 1/2001 | Isaak | |
| 6,364,706 B1 | 4/2002 | Ando et al. | |
| 6,572,410 B1 | 6/2003 | Volstorf et al. | |
| 6,635,955 B2 | 10/2003 | Scheidle | |
| 6,674,653 B1 | 1/2004 | Valentine | |
| 6,677,934 B1 | 1/2004 | Blanchard | |
| 6,740,862 B2 | 5/2004 | Paritsky et al. | |
| 6,771,671 B1 | 8/2004 | Fields et al. | |
| 6,855,933 B2 | 2/2005 | Stone et al. | |
| 6,885,300 B1 | 4/2005 | Johnston et al. | |
| 7,026,710 B2 | 4/2006 | Coyle et al. | |
| 7,172,126 B2 | 2/2007 | Schmidt et al. | |
| 7,229,295 B2 | 6/2007 | Ice et al. | |
| 7,256,483 B2 | 8/2007 | Epler et al. | |
| 7,258,264 B2 | 8/2007 | Ice et al. | |
| 7,277,012 B2 | 10/2007 | Johnston et al. | |
| 7,289,142 B2 | 10/2007 | Silverbrook | |
| 7,348,536 B2 | 3/2008 | Bockel et al. | |
| 7,387,033 B2 | 6/2008 | Qing et al. | |
| 7,387,907 B2 | 6/2008 | Hsu et al. | |
| 7,427,806 B2 | 9/2008 | Arndt et al. | |
| 7,485,818 B2 | 2/2009 | Chou | |
| 7,510,888 B2 | 3/2009 | Guenther et al. | |
| 7,514,666 B2 | 4/2009 | Yee et al. | |
| 7,582,513 B2 | 9/2009 | Kroeninger et al. | |
| 7,675,132 B2 | 3/2010 | Waitl et al. | |
| 7,755,029 B2 | 7/2010 | Tang et al. | |
| 7,767,485 B2 | 8/2010 | Ogawa et al. | |
| 7,851,246 B2 | 12/2010 | Camacho | |
| 8,026,472 B2 | 9/2011 | Arnold | |
| 8,031,174 B2 | 10/2011 | Hamblin et al. | |
| 8,097,852 B2 | 1/2012 | Yao | |
| 8,143,608 B2 | 3/2012 | Yao et al. | |
| 8,207,517 B2 | 6/2012 | Wang et al. | |
| 8,275,922 B2 | 9/2012 | Barrett et al. | |
| 8,420,999 B2 | 4/2013 | Costello et al. | |
| 8,575,537 B2 | 11/2013 | Yao et al. | |
| 2002/0172472 A1 | 11/2002 | Nelson et al. | |
| 2004/0065894 A1 | 4/2004 | Hashimoto et al. | |
| 2005/0088900 A1 | 4/2005 | Chan | |
| 2005/0110157 A1 | 5/2005 | Sherrer et al. | |
| 2005/0199786 A1 | 9/2005 | Yoshida et al. | |
| 2006/0016994 A1 | 1/2006 | Basoor et al. | |
| 2006/0017069 A1 | 1/2006 | Bergmann | |
| 2006/0022212 A1 | 2/2006 | Waitl et al. | |
| 2006/0022215 A1 | 2/2006 | Arndt et al. | |
| 2006/0049533 A1* | 3/2006 | Kamoshita | 264/1.7 |
| 2006/0118807 A1 | 6/2006 | Ives et al. | |
| 2007/0045524 A1* | 3/2007 | Rains et al. | 250/228 |
| 2007/0072321 A1 | 3/2007 | Sherrer et al. | |
| 2007/0085157 A1 | 4/2007 | Fadell | |
| 2007/0246646 A1 | 10/2007 | Lum et al. | |
| 2008/0006762 A1 | 1/2008 | Fadell et al. | |
| 2008/0011939 A1 | 1/2008 | Yee et al. | |
| 2008/0011940 A1 | 1/2008 | Zhang et al. | |
| 2008/0012033 A1 | 1/2008 | Arndt | |
| 2008/0049210 A1 | 2/2008 | Takaoka | |
| 2008/0116379 A1 | 5/2008 | Teder | |
| 2008/0118241 A1 | 5/2008 | TeKolste et al. | |
| 2008/0165115 A1 | 7/2008 | Herz et al. | |
| 2008/0173790 A1 | 7/2008 | Cheng et al. | |
| 2008/0173963 A1 | 7/2008 | Hsu et al. | |
| 2008/0179503 A1 | 7/2008 | Camargo et al. | |
| 2008/0197376 A1 | 8/2008 | Bert et al. | |
| 2008/0223934 A1 | 9/2008 | Havens | |
| 2008/0265266 A1 | 10/2008 | Bogner et al. | |
| 2008/0296478 A1 | 12/2008 | Hernoult | |
| 2008/0308738 A1 | 12/2008 | Li et al. | |
| 2008/0308917 A1 | 12/2008 | Pressel et al. | |
| 2009/0027652 A1 | 1/2009 | Chang et al. | |
| 2009/0057799 A1* | 3/2009 | Chan et al. | 257/433 |
| 2009/0101804 A1 | 4/2009 | Le | |
| 2009/0129783 A1 | 5/2009 | Ori et al. | |
| 2009/0159900 A1 | 6/2009 | Basoor | |
| 2009/0168088 A1 | 7/2009 | Rosenblatt | |
| 2009/0267173 A1 | 10/2009 | Takahashi et al. | |
| 2010/0030039 A1 | 2/2010 | Lamego et al. | |
| 2010/0171027 A1 | 7/2010 | Yun | |
| 2010/0246771 A1 | 9/2010 | Hawver et al. | |
| 2010/0282951 A1 | 11/2010 | Costello et al. | |
| 2010/0327164 A1 | 12/2010 | Costello | |
| 2011/0024627 A1 | 2/2011 | Yao | |
| 2011/0057102 A1 | 3/2011 | Yao | |
| 2011/0057104 A1 | 3/2011 | Yao et al. | |
| 2011/0057129 A1 | 3/2011 | Yao et al. | |
| 2011/0121181 A1 | 5/2011 | Costello et al. | |
| 2011/0204233 A1 | 8/2011 | Costello et al. | |
| 2011/0297831 A1* | 12/2011 | Yao et al. | 250/338.4 |
| 2012/0070145 A1 | 3/2012 | Wong et al. | |
| 2012/0160994 A1 | 6/2012 | Costello et al. | |

FOREIGN PATENT DOCUMENTS

| | | |
|---|---|---|
| EP | 1455564 | 9/2004 |
| GB | 2486000 | 6/2012 |
| JP | 63308973 | 12/1988 |
| JP | 11242926 | 9/1999 |
| JP | 2006-114737 | 4/2006 |
| JP | 2006-261380 | 9/2006 |
| JP | 2008-181097 | 8/2008 |
| JP | 2008-265187 | 11/2008 |
| JP | 2009032571 | 2/2009 |
| JP | 2009-137528 | 6/2009 |
| WO | WO-2006045531 | 5/2006 |
| WO | WO 2008/078806 | 7/2008 |
| WO | WO 2009/072786 | 6/2009 |
| WO | WO-2012068213 | 5/2012 |

OTHER PUBLICATIONS

APDS-9900 and APDS-9901 Digital Proximity and Ambient Light Sensor, Mar. 23, 2011.
APDS-9120 Integrated Optical Sensors Preliminary Datasheet.
APDS-9800 Integrated Ambient Light and Proximity Sensors Data Sheet, Mar. 21, 2011.
Technical Data Sheet NT-MB-IRL3801, Nirtto Denko Corporation, 2008.
Penchem OP 580 IR Filtyer Optoelectronic Epoxy, Apr. 2009.
"Agilent HSDL-9100 Miniature Surface-Mount Proximity Sensor Data Sheet", Dec. 21, 2007.
Avago Technologies, "Avago Technologies Announces Ultra-Thin Integrated Ambient Light and Proximity Sensor Module for Use in Mobile Phones", *Wireless Design and Development* Nov. 27, 2009.
Avago Technologies, "APDS-9005 Miniature Surface-Mount Ambient Light Photo Sensor", Jan. 2007.
Avago Technologies, "APDS-9101—Integrated Reflective Sensor", *Data Sheet* 2007.
Avago Technologies, "APDS-9700 Signal Conditioning IC for Optical Proximity Sensors", Jan. 4, 2008.
Avago Technologies, "HSDL-9100—Surface-Mount Proximity Sensor", *Data Sheet* 2006.
Avago Technologies, "Integrated Optical Proximity Sensors Prelim Datasheet", *APDS-9120* Feb. 25, 2009.
AZ Optics, "Device Debuts as the World's Best-Performing Integrated Light/Proximity Sensor", Nov. 11, 2008.
Costello, "U.S. Appl. No. 12/495,739", *Optical Proximity Sensor Package with Molded Infrared Light Rejection Barrier and Infrared Pass Components* Jun. 30, 2009.
IDES—The Plastic Web, "Si Photo Diode Chip", Dec. 19, 2007.
Ishihara, "A Dual Face Package Using a Post with Wire Components: Novel Structure for PoP Wafer Level CSP and Compact Image Sensor Package", *Electronic Components and Technology Conference* 2008, 1093-1098.
Khamal, Ibrahim "Infra-Red Proximity Sensor (II)", Apr. 4, 2008.

(56) References Cited

OTHER PUBLICATIONS

Losee, "A ⅓ Format Image Sensor with Refractory Metal Light Shield for Color Video Applications", *Solid State Circuits Conference, Digest of Technical Papers, 36th ISSCC, IEEE International Volume*. Feb. 1989, 90-91.

Nitto Denko Corporation, "Technical Data Sheet", *NT-8506* 2001.

Penchem Technologies Data Sheet, "Penchem OP 579", *IR Pass Optoelectronic Epoxy* Apr. 2009.

Tan, "U.S. Appl. No. 12/623,767", *Ifrared Proximity Sensor Package with Improved Crosstalk Isolation*, filed Nov. 23, 2009, 30 pages.

Tyntek, "Data Sheet for AlGaAs/GaAs Infrared Chip", TK116IRA Nov. 2006.

Tyntek, "Data Sheet for AlGaAs/GaAs Infrared Chip", TK 114IRA Mar. 2004.

Tyntek, "Data Sheet for Si Photo-diode Chip", TK 043PD Jun. 2004.

Tyntek, "Si Photo-Diode Chip—TK043PD Data Sheet", Dec. 19, 2007.

Xydar, "G-930—Solvay Advanced Polymers—Liquid Crystal Polymer Data Sheet", reproduced from website at www.ides.com/grades/ds/E22219.htm on Dec. 17, 2007.

"A4 Masking Sheet—A4 Masking Sheet", Downloaded from website: <http://www.stix2.com.au/a4-masking-sheet-13/a4-masking-sheet.html> 2012, Product Description.

"Altera 40/100 Gigabit Ethernet", *Altera Corporation Product Sheet* Copyright 1995-2012, 3 pages.

"Altera's 10-Gbps Ethernet (XAUI) Solution", *Altera Corporation Product Sheet*, Copyright 1995-2012, 2 pages.

"Nordson Ink-Dot I.D. System", *Nordson Corporation Product Sheet 2012*, 2 pages.

"SerialLite II Protocol", *Altera Reference Manual* Oct. 2005, 84 pages.

Morgavi, Paul, "Panasonic Print Head Technology and Market Applications", *IMI Europe, Digital Printing Conferences 2007, Presentation*, Nov. 7 to 9, 2007, 24 pages.

\* cited by examiner

INFRARED ATTENUATING OR BLOCKING LAYER IN OPTICAL PROXIMITY SENSOR

RELATED APPLICATIONS

This application claims priority and other benefits from, and is a continuation-in-part of, U.S. patent application Ser. No. 12/495,739 filed Jun. 30, 2009 entitled "Optical Proximity Sensor Package with Molded Infrared Light Rejection Barrier and Infrared Pass Components" to Costello et al. (hereafter "the '739 patent application"). The '739 patent application is also incorporated by reference herein, in its entirety.

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of handheld electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 55 and 57, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1, optical proximity sensor 10 further comprises metal housing or shield 18 formed of metal and comprising apertures 55 and 57 located over light emitter 16 and light detector 12, respectively, such that at least a first portion of light 15 emitted by light detector 12 passes through aperture 55, and at least a second portion of the first portion 19 of light reflected from object 50 in proximity to sensor 10 passes through aperture 57 for detection by light detector 12. As shown, metal housing or shield 18 may further comprise first and second modules 61 and 63 within which light emitter 16 and light detector 12 are disposed, respectively. The first and second modules 61 and 63 comprise adjoining optically opaque metal inner sidewalls 25 to provide optical isolation between first and second modules 61 and 63.

Many optical proximity sensors generally include a metal shield, such as shield or housing 18 of the type shown in FIG. 1, to provide optical isolation between light emitter 16 and light detector or photodiode 12 so that undesired optical cross-talk between emitter 16 and detector 12 is minimized. See, for example, the Data Sheets corresponding to the AVAGO TECHNOLOGIES™ APDS-9120 Integrated Optical Sensors Preliminary Datasheet and the AVAGO TECHNOLOGIES™ APDS-9800 Integrated Ambient Light and Proximity Sensors Preliminary Datasheet, each of which is hereby incorporated by reference herein, each in its respective entirety.

The amount of reflected, diffracted or refracted IR radiation and undesired crosstalk or interference between light emitter 16 and light detector 12 may also be exacerbated by the presence of a window disposed above sensor 10, which in some applications is provided as part of a portable or other type of electronic device in which proximity sensor 10 is housed and mounted.

FIG. 2 shows a prior art optical proximity sensor 10 with metal shield or housing 18. The optical proximity sensor shown in FIG. 2 is an AVAGO TECHNOLOGIES™ APDS-9120 Integrated Optical Proximity Sensor, which contains a molded plastic substrate 11 upon which are mounted LED 16 and light detector or photodiode 12. Single-piece metal shield 18 covers LED 16 and light detector or photodiode 12 and contains a downwardly projecting light barrier 65 disposed therebetween (not shown in FIG. 2). Electrical contacts 17 provide a means to establish electrical connections between proximity sensor 10 and external devices. In the APDS-9120 optical proximity sensor, metal shield 18 is formed and thinned using conventional metal stamping techniques, and is affixed to the underlying plastic substrate 11 by gluing. The APDS-9120 sensor has an areal footprint of only 4 mm by 4 mm, and thus is quite small.

FIG. 3 shows a prior art optical proximity sensor 10 with a more complicated metal shield or housing 18 than that of FIG. 2. The optical proximity sensor shown in FIG. 3 is an AVAGO TECHNOLOGIES™ APDS-9800 Integrated Ambient Light and Proximity Sensor, which contains a printed circuit board ("PCB") substrate 11 upon which are mounted LED 16, light detector or photodiode 12, and ambient light sensor 14. The one-piece metal shield 18 covers LED 16, light detector or photodiode 12, and ambient light sensor 14 and contains a downwardly projecting light barrier 65 disposed therebetween. In the APDS-9800 optical proximity sensor, metal shield 18, being of a considerably more complicated shape and geometry than that of FIG. 2, is formed and thinned using more advanced progressive metal stamping techniques, and must be hand-fitted and attached to the underlying PCB by gluing to ensure proper alignment and fit.

As will now be seen, at least some optical proximity sensors of the prior art rely upon the use of an externally mounted metal shield 18, which is required to reduce the amount of crosstalk or interference that might otherwise occur between LED 16 and light detector 12, as well as to help increase the detection distance of the device. Metal shields 18 are quite small, however, making them difficult to manufacture in high volumes, and thus expensive to fabricate. Such metal shields 18 also generally require expensive automated equipment to attach same to sensors 10 in a mass production setting. Moreover, the quality of metal shields 18 often varies, and issues commonly arise with suppliers being unable to meet the tight dimensional tolerances required for such small devices. Metal shields 18 can also detach from sensor 10, thereby adding another failure point for sensor 10.

What is need is an optical proximity sensor design that eliminates the need to include a metal shield 18, but which retains high crosstalk and interference rejection characteristics so that an optical proximity sensor can be provided that features improved performance, lower cost, increased manufacturability and improved reliability.

SUMMARY

In some embodiments, there is provided an optical proximity sensor comprising an infrared light emitter operably connected to and driven by a light emitter driving circuit, a light detector operably connected to and driven by a detector sensing circuit, a first component disposed over and covering at least portions of the light emitter and comprising first external surfaces thereof, and a second component disposed over and covering at least portions of the light detector and comprising second external surfaces thereof, the first and second components being separated at least partially by a gap disposed therebetween, wherein the sensor is configured such that at least a first portion of light emitted by the light detector passes through a portion of the first component, at least a second portion of the first portion of light reflected from an object of interest in proximity to the sensor passes through a portion of the second component for detection by the light detector, a layer of infrared attenuating or blocking material is disposed over at least portions of the first and second external surfaces located adjacent to the gap, and the infrared attenuating or blocking material is configured to attenuate or block substantially the transmission of undesired direct, scattered or reflected infrared light between the light emitter and the light detector and thereby minimize optical crosstalk and interference between the light emitter and the light detector.

In other embodiments, there is provided a method of making an optical proximity sensor comprising mounting an infrared light emitter on a substrate, mounting an infrared light detector on the substrate, the infrared light detector being spaced apart from the infrared light emitter on the substrate, forming or placing a first infrared light pass component over at least portions of the light emitter, the first infrared light pass component comprising first external surfaces, forming or placing a second infrared light pass component over at least portions of the light detector such that at least portions of the first and second components are separated by a gap, the second infrared light pass component comprising second external surfaces, and forming or placing a layer of infrared light attenuating or blocking material over at least portions of the first and second external surfaces located adjacent to the gap, the infrared light attenuating material being configured to attenuate or block substantially the transmission of undesired direct, scattered or reflected infrared light between the light emitter and the light detector and thereby minimize optical crosstalk and interference between the light emitter and the light detector.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

Figure 1:
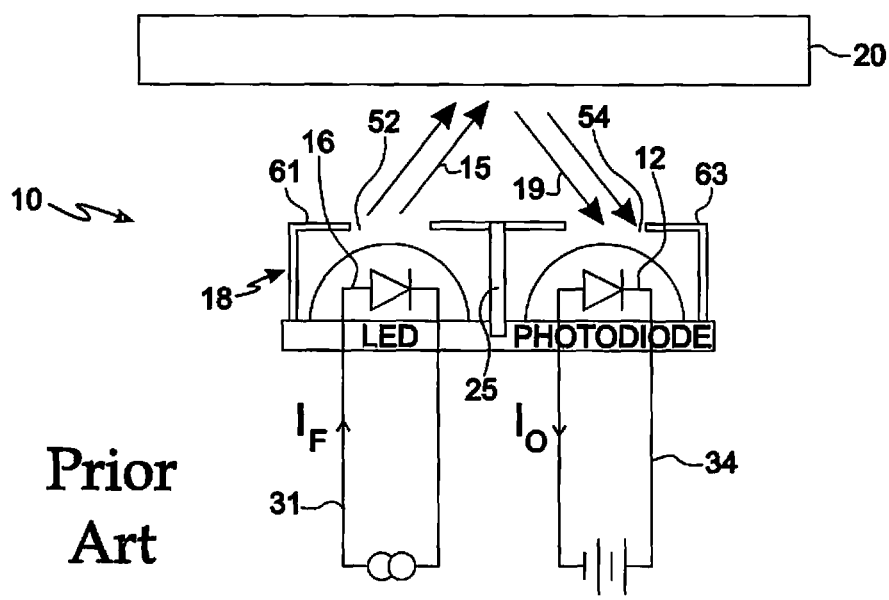
FIG. 1 shows a prior art optical proximity sensor and associated circuitry.
Figure 2:
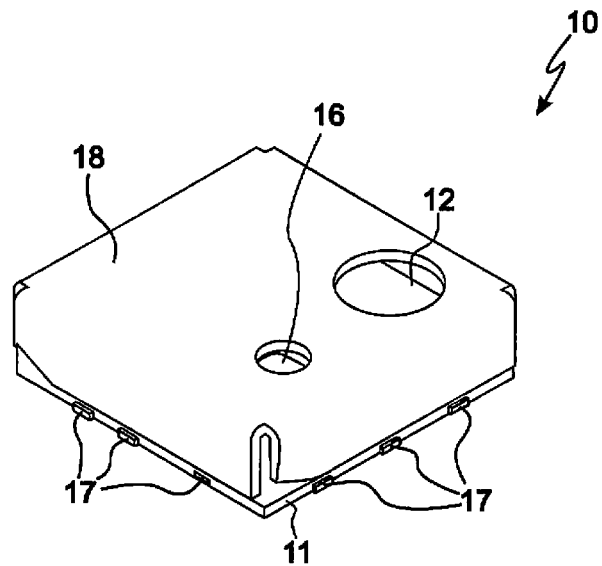
FIG. 2 shows a prior art optical proximity sensor with a metal shield or housing.
Figure 3:
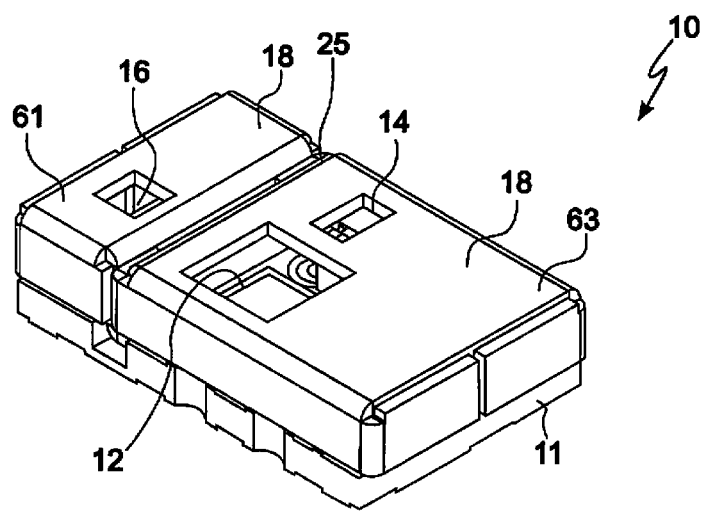
FIG. 3 shows a prior art optical proximity sensor with a more complicated metal shield or housing than that shown in FIG. 2.
Figure 4:
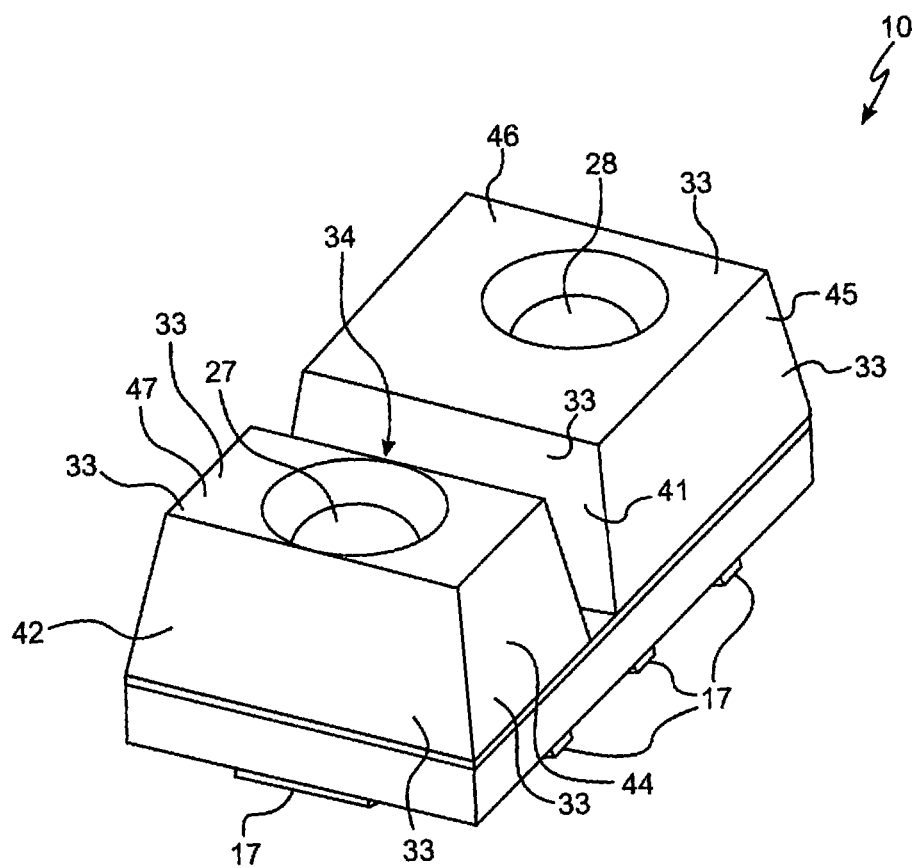
FIG. 4 shows a top perspective view of one embodiment of an optical proximity sensor.
Figure 5:
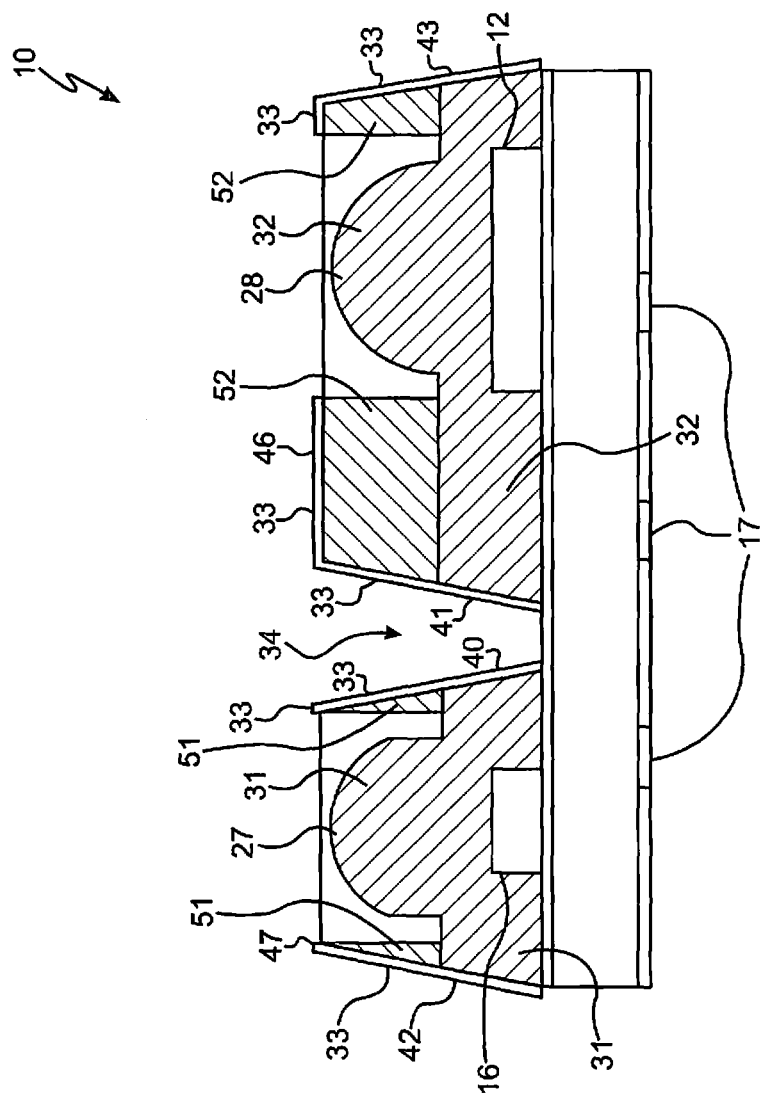
FIG. 5 shows a cross-sectional view of the optical proximity sensor of FIG. 4.

Referring now to FIGS. 4 and 5, there are shown top perspective and cross-sectional views of one embodiment of an optical proximity sensor 10 comprising light emitter 16 mounted on substrate 11 and separated from light detector 12 by gap 34, optically transmissive materials 31 and 32 (or first and second components 31 and 32), which are preferably single mold two-part epoxy or transfer molding compounds, and infrared opaque, light attenuating or blocking layers 33 disposed over at least portions of components 31 and 32 located adjacent to gap 34, and preferably disposed elsewhere on other external surfaces of sensor 10.

Light rays transmitted through optically transmissive material or first component 31 and originating from light emitter 16, and other reflected, diffracted or refracted IR radiation, might, but for the presence of layers 33, leak across to light detector 12 through optically transmissive material 32 (or second component 32), which would manifest itself as undesired crosstalk or interference between light emitter 16 and light detector 12 and thereby degrade the performance of proximity sensor 10.

FIGS. 4 and 5 show one embodiment of sensor 10 that provides solutions to the problems described above in the Background section, where metal barrier 25 is eliminated altogether. Continuing to refer to FIGS. 4 and 5, there is shown optical proximity sensor 10 comprising infrared light emitter 16 (which is operably connected to and driven by a light emitter driving circuit), and light detector 12 (which is operably connected to and driven by a detector sensing circuit, the details of which are not shown in FIG. 7). In one embodiment, a first molded optically transmissive infrared light pass component 31 is disposed over and covers at least portions of light emitter 16 and a second molded optically transmissive infrared light pass component 32 is disposed over and covers at least portions of light detector 12. Optical lenses 27 and 29, preferably formed of the same material, and formed at the same time during the manufacturing process as first and second molded optically transmissive infrared light pass components 31 and 32, are disposed over light emitter 16 and light detector 12, respectively. Located in-between light emitter 16 and first molded optically transmissive infrared light pass material and first component 31, and light detector 12 and second molded optically transmissive infrared light pass material and second component 32, is gap 34 (preferably an air gap, but which may also be a gap filled with a suitable material) and infrared or optically opaque, attenuating or blocking layers 33 disposed on, by way of example, external surfaces 40, 41, 42, 43, 44, 45, 46 and 47 of first and second components 31 and 32, where layers 33 preferably comprise an optically opaque non-transmissive infrared light barrier component or additive. At least a first portion of light 15 emitted by light detector 16 passes through first component 31, and at least a second portion 19 of the first portion of light 15 reflected from an object of interest in proximity to proximity sensor 10 passes through second component 32 for detection by light detector 12. Infrared or optically opaque, attenuating or blocking layers 33 substantially attenuate or block the transmission of undesired direct, scattered or reflected light between light emitter 16 and light detector 12, and thereby minimize optical crosstalk and interference between light emitter 16 and light detector 12.

According to one embodiment, first and second molded optically transmissive infrared light pass components 31 and 32 are formed using an infrared-pass and optically transmissive transfer molding compound such as NITTO DENKO™ NT-8506 clear transfer molding compound or PENCHEM Technologies™ OP 579 infrared pass optoelectronic epoxy. Other suitable optically transmissive epoxies, plastics, polymers or other materials may also be employed. In some embodiments, and as discussed in further detail below, optically transmissive infrared light pass components 31 and 32 are molded during the same manufacturing step, or may be molded separately. See Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009, both of which documents are hereby incorporated by reference herein, each in its respective entirety.

Referring now to FIG. 5, there are shown third and fourth components 51 and 52, which are located above first and second components 31 and 32. Third and fourth components 51 and 52 are preferably molded onto the top surfaces of first and second components 31 and 32, and according to one embodiment may comprise an infrared-blocking, filtering or cutting transfer molding compound such as NITTO DENKO198 NT-MB-IRL3801 two-part epoxy resin material or PENCHEM Technologies™ OP 580 infrared filter optoelectronic epoxy, either of which preferably contains an amount of an infrared cutting material that has been selected by the user to achieve acceptable infrared light blocking performance while minimizing the amount of such infrared cutting material employed to keep costs to a minimum. Other suitable optically non-transmissive epoxies, plastics, polymers or other materials may also be employed to form third and fourth components 51 and 52, as may optically-transparent materials in the event that layers 33 are found to provide adequate levels of optical isolation. See Technical Data Sheet NT-MB-IRL3801 published by DENKO™ dated 2008 and PENCHEM OP 580 IR Filter Optoelectronic Epoxy Data Sheet, Revision 1, dated April, 2009, both of which documents are hereby incorporated by reference herein, each in its respective entirety.

Figure 7:
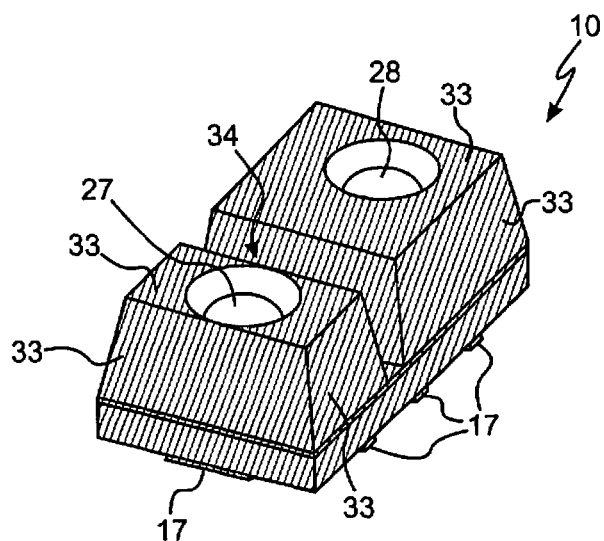

Continuing to refer to FIG. 5, infrared opaque, light attenuating or blocking layers 33 are disposed over at least some of the external surfaces of first and second components 31 and 32, and optionally over at least portions of third and fourth components 51 and 52, preferably, although not necessarily, after first and second components 31 and 32, and third and fourth components 51 and 52 have been formed in place atop substrate 11 and over light emitter 16 and light detector 12. It is especially important that at least portions of external surfaces 40 and 41 adjacent gap 34 be covered with layers 33 so as to effectively block the transmission of infrared light across gap 34. Better yet, and as shown in FIG. 7, most external surfaces of sensor 10 are covered with layers 33 so as to minimize undesired crosstalk between emitter 16 and detector 12. Note that substrate 11 may be, by way of example, a printed circuit board (PCB), lead frame, or the like. Additionally, and according to one embodiment, after first and second components 31 and 32, and third and fourth components 51 and 52 have been formed in place by, for example, molding, gap 34 is formed by cutting a groove corresponding to gap 34 between first component 31 and third component 51 on the one hand, and second component 32 and fourth component 52 on the other hand. This grove cutting and gap forming step may be carried out during the singulation process, more about which is said below. Note that external surfaces 40 and 41 preferably have angles ranging between about 2 degrees and 30 degrees from vertical to help facilitate the application of layers 33 thereon.

Figure 6:
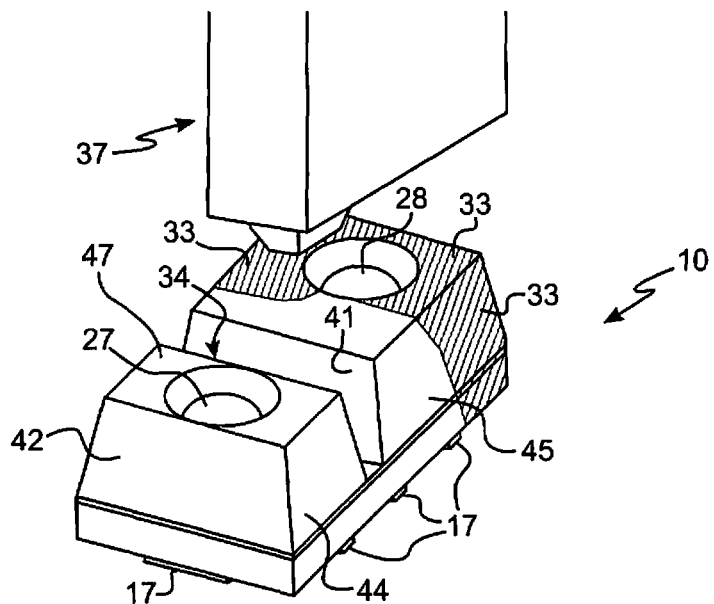
FIGS. 6 and 7 show one method of applying layers 33 to external surfaces of a proximity sensor.

Referring now to FIGS. 6 and 7, there is shown one embodiment of a method for applying layers 33 to the external surfaces of sensor 10. Ink dispenser 37 is configured to spray an appropriate optically opaque infrared ink controllably over sensor 10 such that, for example, lenses 27 and 28 and electrical contacts 17 are not covered with layers 33. In. FIG. 6, the spraying operation is in progress and not yet completed. In FIG. 7, the spraying operation has been completed and most the external surfaces of sensor 10 have been covered with layers 33. According to some embodiments, layers 33 may be formed, for example, using suitable infrared opaque, attenuating or blocking paints, inks, dyes or other materials. Such materials may further comprise infrared cut or blocking additives. Layers 33 may be formed to have thicknesses ranging between about 2 microns and about 100 microns, or between about 10 microns and about 40 microns. Layers 33 may be applied to at least portions of the external surfaces of sensor 10 by any one or more of spraying, dipping, brushing, rolling, electrodepositing, and sputtering a suitable infrared light attenuating material thereon.

Figure 8:
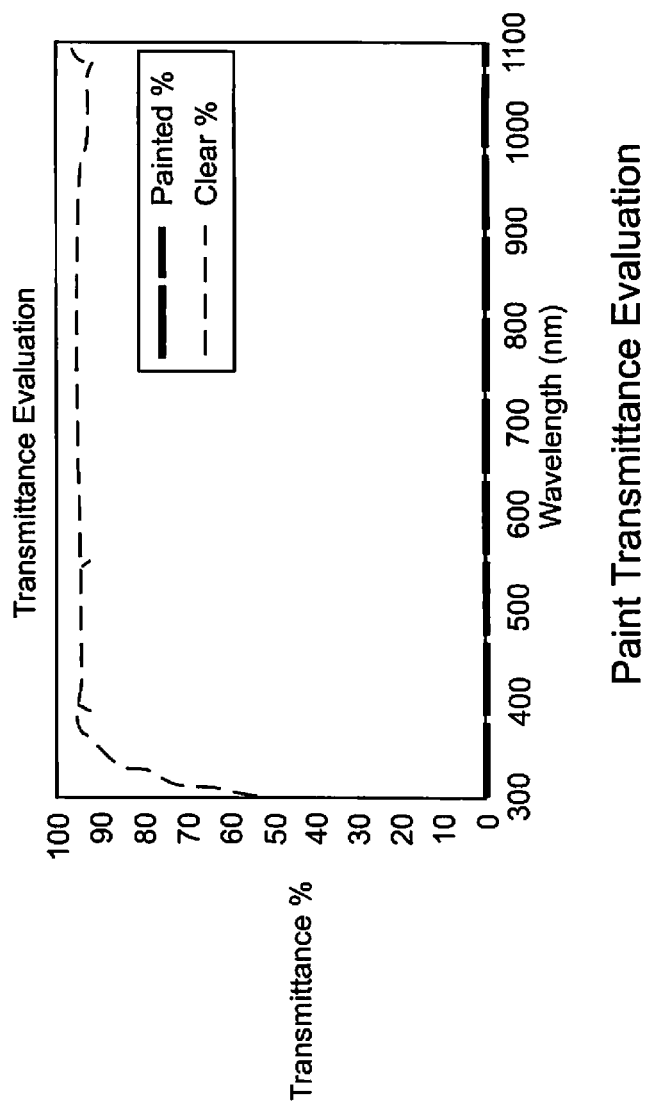
FIG. 8 shows comparative optical isolation results obtained with an optical proximity sensor having optically attenuating ink applied and not applied to the external surfaces thereof.

One material suitable for application on the external surfaces of sensor 10 to form layers 33 is an ink manufactured in Singapore under the name "DIC SCREEN INK," product Number 21-S175, having the designation "Safire Black." This material was tested by applying same to the external surfaces of an AVAGO TECHNOLOGIES APDS-9900 proximity sensor manufactured in accordance with the foregoing description regarding the first, second, third and fourth components, and the application of layers 33 to the external surfaces thereof. A Data Sheet entitled "APDS-9900 AND APDS-9901 Digital Proximity and Ambient Light Sensor" published by Avago Technologies on Mar. 23, 2011 is hereby incorporated by reference herein, in its entirety. FIG. 8 shows results obtained with and without layers 33 applied to sensor 10. FIG. 8 shows that the effectiveness of layers 33 in providing optical isolation is quite dramatic.

Figure 9:
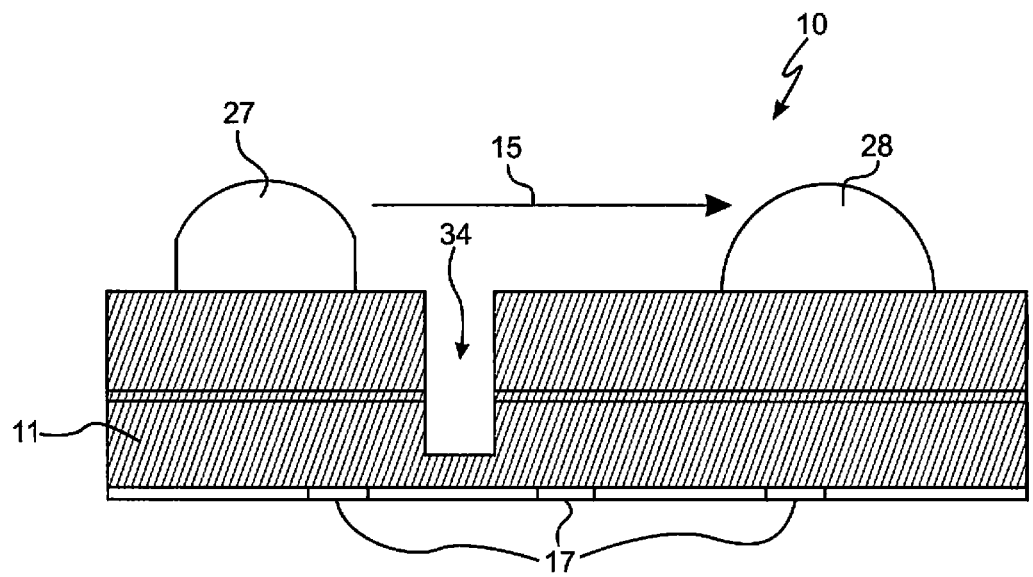
FIGS. 9 and 10 show two different test proximity sensors.
Figure 10:
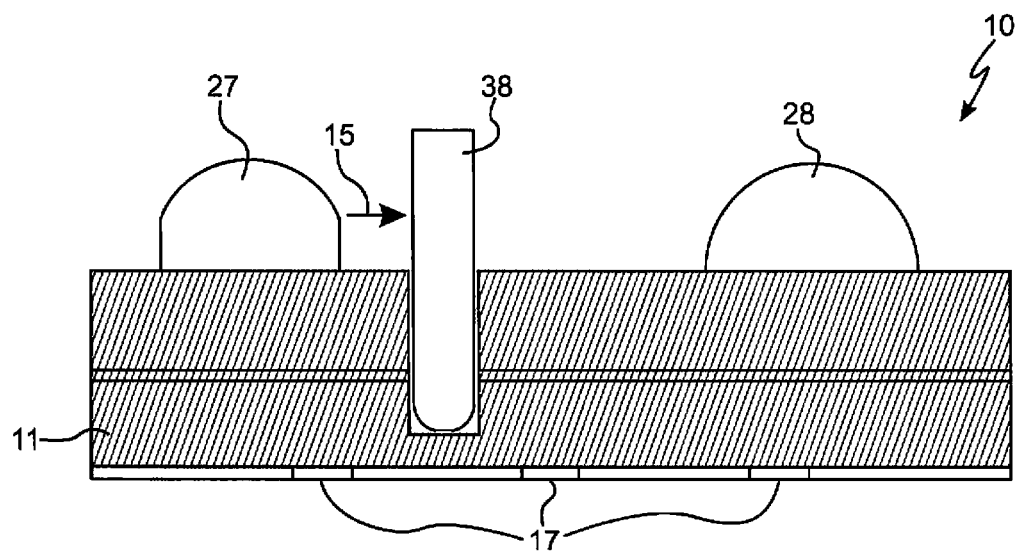

FIGS. 9 and 10 show examples of test devices that were built in accordance with the above teachings, where layers 33 comprising "DIC SCREEN INK" were applied to the external surfaces of sensor 10 (excepting electrical contacts 17 and lenses 27 and 28). In the example device of FIG. 9, where no additional light barrier 38 was disposed between lens 27 and lens 28, crosstalk was measured at 299 counts (which according to APDS-9900 specifications should not exceed a count of 200), and signal values of 684 counts were measured ((which according to APDS-9900 specifications range between 440 and 640). In the example device of FIG. 10, additional light barrier 38 was disposed between lens 27 and lens 28, and crosstalk was measured at 152 counts (which according to APDS-9900 specifications should not exceed a count of 200), and signal values of 619 counts were measured (which according to APDS-9900 specifications should range between 440 and 640). These test results further confirm the efficacy and effectiveness of layers 33 in providing optical isolation between various portions of sensor 10.

Figure 11:
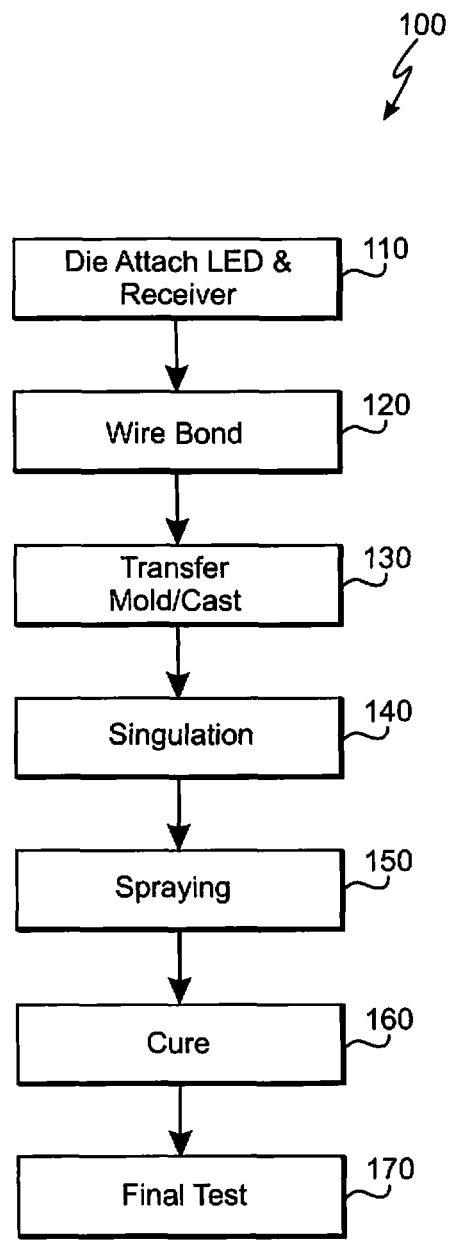
FIG. 11 shows a method of making an optical proximity sensor according to one embodiment.

FIG. 11 illustrates a method 100 of making optical proximity sensor 10 according to one embodiment. As shown in FIG. 11, the light emitter and detector dice are attached to substrate 11 in step 110 using epoxy. In one embodiment substrate 11 is a printed circuit board or PCB, or may be a lead frame. At step 120, the light emitter and detector dice are wire-bonded to substrate 11. Next, in step 130, first and second components comprising optically transmissive infrared light pass components 31 and 32 are molded over light emitter 16 and light detector 12 using a suitable infrared-pass and optically transmissive transfer molding compound. In an optional step not shown in FIG. 11, an integrated circuit is attached to substrate 11, where integrated circuit 35 contains the electronic circuitry required to drive light emitter 16, and process output signals provided by light detector 12, and optionally contains an ambient light sensor. Such an integrated circuit 35 is preferably wire-bonded to substrate 11. At step 130, substantially optically non-transmissive infrared light components 51 and 52 may also be molded onto the top surfaces of first and second optically transmissive infrared light pass components 31 and 32, and are preferably configured and compatible in respect of molded first and second optically-transmissive components 31 and 32 to bond thereto without delaminating under normal operating conditions.

Note that in FIG. 11, at steps 110 through 170, a plurality of PCB substrates 11 may be provided on a panel with light emitter dice and light detector dice attached and then wire-bonded thereto. Light emitter dice and light detector dice are then overmolded using cast or transfer molding techniques with a suitable optically-transmissive material to form first and second optically transmissive infrared light pass components 31 and 32 and lenses 27 and 28. Mold runners may be provided to facilitate the distribution of the various molding materials to the various PCB substrates. Light emitter driver integrated circuits containing integrated ambient light sensors may also be attached to such PCB substrates 11, and then wirebonded thereto. The entire PCB panel may be sheet cast using a suitable infrared cut, filter or block material to form substantially optically non-transmissive infrared third and fourth components 51 and 52 atop first and second optically transmissive infrared light pass components 31 and 32. Individual proximity sensors 10 may then be singulated by, for example, using sawing techniques well known to those skilled in the art, where mold runners are also removed. See step 140 in FIG. 11.

At step 150 in FIG. 11, layers 33 are applied to the desired external surfaces of the proximity sensor by, for example, spraying. The spraying step is followed by curing at step 160, and final testing of sensor 10 at step 170.

Included within the scope of the present invention are methods of making and having made the various components, devices and systems described herein.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor, comprising:
    an infrared light emitter operably connected to and driven by a light emitter driving circuit;
    a light detector operably connected to and driven by a detector sensing circuit;
    a first component disposed over and covering at least portions of the light emitter and comprising first external surfaces thereof, and
    a second component disposed over and covering at least portions of the light detector and comprising second external surfaces thereof, the first and second components being separated at least partially by a gap disposed therebetween, the gap corresponding to a void of material;
    wherein the sensor is configured such that at least a first portion of light emitted by the light emitter passes through a portion of the first component, at least a second portion of the first portion of light reflected from an object of interest in proximity to the sensor passes through a portion of the second component for detection by the light detector, a layer of infrared attenuating or blocking material is disposed over at least portions of the first and second external surfaces located adjacent to the void of material, and the infrared attenuating or blocking material is configured to attenuate or block substantially the transmission of undesired direct, scattered or reflected infrared light between the light emitter and the light detector and thereby minimize optical crosstalk and interference between the light emitter and the light detector.

2. The optical proximity sensor of claim 1, wherein the layer of infrared light attenuating material is one of a paint, an ink and a dye.

3. The optical proximity sensor of claim 1, wherein the infrared light attenuating material comprises an infrared cut or blocking additive.

4. The optical proximity sensor of claim 1, wherein the infrared light attenuating material is disposed substantially over at least most of the first and second external surfaces.

5. The optical proximity sensor of claim 1, wherein the layer of infrared light attenuating material has a thickness ranging between about 2 microns and about 100 microns.

6. The optical proximity sensor of claim 1, wherein the layer of infrared light attenuating material has a thickness ranging between about 10 microns and about 40 microns.

7. The optical proximity sensor of claim 1, wherein the layer of infrared light attenuating material is applied to the at least portions of the first and second external surfaces by one of spraying, dipping, brushing, rolling, electrodepositing, and sputtering the infrared light attenuating material thereon.

8. The optical proximity sensor of claim 1, wherein at least one of the first and second components is a molded or casted infrared light pass material.

9. The optical proximity sensor of claim 8, wherein the molded or casted infrared light pass material comprises an optically transmissive epoxy, polymer or plastic.

10. The optical proximity sensor of claim 1, further comprising a substrate upon which the light emitter and the light detector are operably mounted.

11. The optical proximity sensor of claim 10, wherein the substrate is a printed circuit board ("PCB").

12. The optical proximity sensor of claim 1, wherein at least one of the light emitter and light detector is a semiconductor die.

13. The optical proximity sensor of claim 1, further comprising at least one integrated circuit operably connected to the light emitter and the light detector, the integrated circuit being configured to control the operation of the light emitter and the light detector and to process output signals provided by the light detector.

14. The optical proximity sensor of claim 13, wherein the at least one integrated circuit further comprises a proximity sensor application specific integrated circuit (ASIC) and a master control unit (MCU).

15. The optical proximity sensor of claim 1, wherein the optical proximity sensor is incorporated into a portable electronic device.

16. The optical proximity sensor of claim 15, wherein the portable electronic device is a mobile telephone, a personal data assistant (PDA), a laptop computer, a notebook computer, or a computer.

17. The optical proximity sensor of claim 1, wherein the light emitter is an LED.

18. The optical proximity sensor of claim 1, wherein the light detector is a positive-intrinsic-negative ("PIN") diode.

19. The optical proximity sensor of claim 1, wherein a molded optically transmissive lens is formed over the light emitter or the light detector.

20. A method of making an optical proximity sensor, comprising:
mounting an infrared light emitter on a substrate;
mounting an infrared light detector on the substrate, the infrared light detector being spaced apart from the infrared light emitter on the substrate;
forming or placing a first infrared light pass component over at least portions of the light emitter, the first infrared light pass component comprising first external surfaces;
forming or placing a second infrared light pass component over at least portions of the light detector such that at least portions of the first and second components are separated by a gap that comprises a void of material, the second infrared light pass component comprising second external surfaces; and
forming or placing a layer of infrared light attenuating or blocking material over at least portions of the first and second external surfaces located adjacent to the void of material while maintaining the void of material between the first and second external surfaces, the infrared light attenuating material being configured to attenuate or block substantially the transmission of undesired direct, scattered or reflected infrared light between the light emitter and the light detector and thereby minimize optical crosstalk and interference between the light emitter and the light detector.

21. The method of claim 20, wherein the layer of infrared light attenuating material is one of a paint, an ink and a dye.

22. The method of claim 20, further comprising adding an infrared cut or blocking additive to the infrared light attenuating material.

23. The method of claim 20, further comprising forming or placing the infrared light attenuating material over substantially most of the first and second external surfaces.

24. The method of claim 20, wherein the layer of infrared light attenuating material has a thickness ranging between about 2 microns and about 100 microns.

25. The method of claim 20, wherein the layer of infrared light attenuating material has a thickness ranging between about 10 microns and about 40 microns.

26. The method of claim 20, wherein the layer of infrared light attenuating material is formed or placed over the at least portions of the first and second external surfaces by one of spraying, dipping, brushing, rolling, electrodepositing, and sputtering the infrared light attenuating material thereon.

27. The method of claim 20, wherein the first and second infrared light pass components are molded, transfer-molded, casted, or sheet-casted.

28. The method of claim 20, wherein optically transmissive lenses are formed over the light emitter and the light detector when the first or second infrared light pass component is molded or casted.

* * * * *